(12) United States Patent
Yamagishi et al.

(10) Patent No.: US 10,326,626 B2
(45) Date of Patent: *Jun. 18, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Toshiyuki Yamagishi, Fuchu Tokyo (JP); Tomoya Horiguchi, Inagi Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/221,667

(22) Filed: Dec. 17, 2018

(65) Prior Publication Data

US 2019/0116072 A1   Apr. 18, 2019

Related U.S. Application Data

(63) Continuation of application No. 15/862,929, filed on Jan. 5, 2018, now Pat. No. 10,193,717.

(30) Foreign Application Priority Data

Mar. 22, 2017   (JP) .................................. 2017-056533
Sep. 1, 2017    (JP) .................................. 2017-168780

(51) Int. Cl.
*H04L 27/10*   (2006.01)
*H04L 25/49*   (2006.01)
(Continued)

(52) U.S. Cl.
CPC ........ *H04L 25/4904* (2013.01); *G02B 6/2932* (2013.01); *G06E 1/02* (2013.01);
(Continued)

(58) Field of Classification Search
CPC . H04L 25/4904; H04L 7/041; H04L 27/2096; H03M 5/12; G02B 6/2932; G06E 1/02
(Continued)

(56) References Cited

U.S. PATENT DOCUMENTS 4,992,790 A   2/1991  Montgomery
7,260,493 B2  8/2007  Laquai et al.
(Continued)

FOREIGN PATENT DOCUMENTS

EP   1715586 A2   10/2006
EP   2557703 A1   2/2013
(Continued)

*Primary Examiner* — Dhaval V Patel
(74) *Attorney, Agent, or Firm* — White & Case LLP

(57) ABSTRACT

A semiconductor device of an embodiment includes first and second couplers, an encoding circuit, and a demodulating circuit. The encoding circuit executes differential Manchester encoding on digital data based on a clock inputted thereto via the first coupler and outputs an encoded data. The demodulating circuit includes a first sampling circuit which samples the encoded data inputted via the second coupler based on a sampling frequency set to be two times higher than that of the encoded data and which outputs first sample data, a second sampling circuit which samples the encoded data at a timing earlier than that in the first sampling circuit and which outputs second sample data, a determination circuit which determines whether or not the first and the second sample data match each other, and a selection circuit which selects first phase data or second phase data from the first sample data.

11 Claims, 10 Drawing Sheets

(51) Int. Cl.

| | |
|---|---|
| *H04L 27/233* | (2006.01) |
| *H03M 5/12* | (2006.01) |
| *H03M 5/06* | (2006.01) |
| *H04L 7/00* | (2006.01) |
| *G02B 6/293* | (2006.01) |
| *H04L 7/04* | (2006.01) |
| *G06E 1/02* | (2006.01) |
| *H04L 27/20* | (2006.01) |
| *H04Q 11/00* | (2006.01) |

(52) U.S. Cl.
CPC ............... *H03M 5/06* (2013.01); *H03M 5/12* (2013.01); *H04L 7/0041* (2013.01); *H04L 7/041* (2013.01); *H04L 27/2096* (2013.01); *H04L 27/2338* (2013.01); *H04Q 11/0066* (2013.01); *H04Q 2011/006* (2013.01)

(58) Field of Classification Search
USPC ....... 375/282, 295, 316, 340, 341, 362, 375, 375/376; 341/53, 69, 70, 71
See application file for complete search history.

(56) References Cited

U.S. PATENT DOCUMENTS

| | | | |
|---|---|---|---|
| 7,864,894 | B2 | 1/2011 | Terada |
| 8,384,568 | B2 | 2/2013 | Govindammagari et al. |
| 2010/0045492 | A1 | 2/2010 | Chang et al. |

FOREIGN PATENT DOCUMENTS

| | | |
|---|---|---|
| JP | 2005-005956 A | 1/2005 |
| JP | 2008-167058 A | 7/2008 |
| JP | 4594896 B2 | 12/2010 |
| JP | 2011-061525 A | 3/2011 |
| JP | 2014-522168 A | 8/2014 |

SEMICONDUCTOR DEVICE

CROSS-REFERENCE TO RELATED APPLICATIONS

This application is a continuation based on application Ser. No. 15/862,929, filed Jan. 5, 2018, and is based upon and claims the benefit of priority from Japanese Patent Applications No. 2017-056533, filed on Mar. 22, 2017 and No. 2017-168780, filed on Sep. 1, 2017; the entire contents of which are incorporated herein by reference.

FIELD

Embodiments of the present invention relate to a semiconductor device.

BACKGROUND

As an example of data transmission, optical transmission performed by a photocoupler has been known. In some cases where such optical transmission is performed, data is transmitted from a transmission side (a primary side) to a reception side (a secondary side) via a photocoupler, and a clock is transmitted from the reception side to the transmission side via another photocoupler.

In this case, if a transmission delay occurs during the data transmission using the photocoupler, etc., the transmission side and the reception side become asynchronous, so that a data error may occur at the reception side.

An embodiment of the present invention provides a semiconductor device in which the possibility of generating a data error at a reception side can be reduced even when a transmission side and the reception side are asynchronous.

DETAILED DESCRIPTION

Embodiments will now be explained with reference to the accompanying drawings. The present invention is not limited to the embodiments.

First Embodiment

Figure 1:
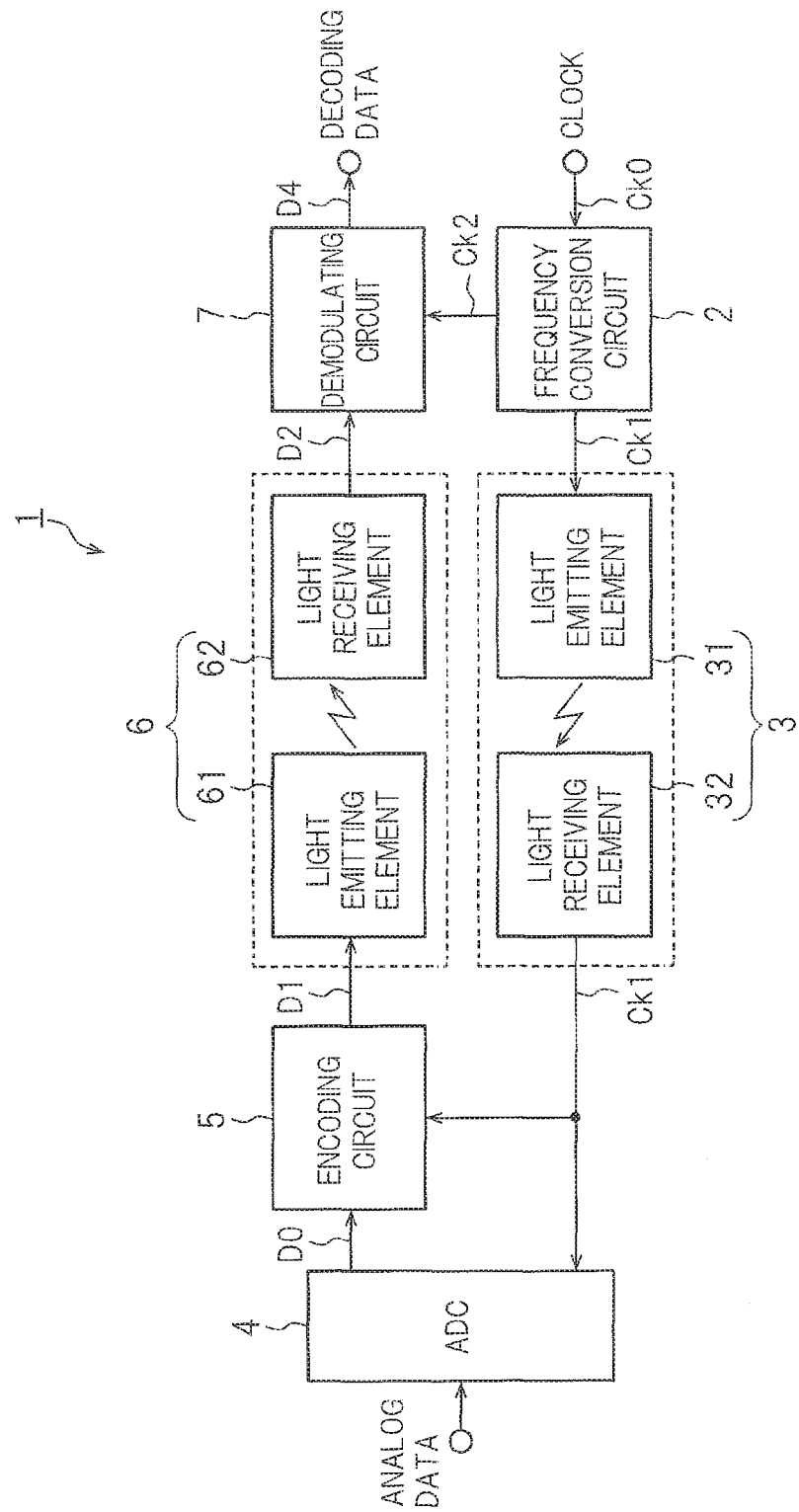
FIG. 1 is a schematic block diagram of a semiconductor device according to a first embodiment.
Figure 2:
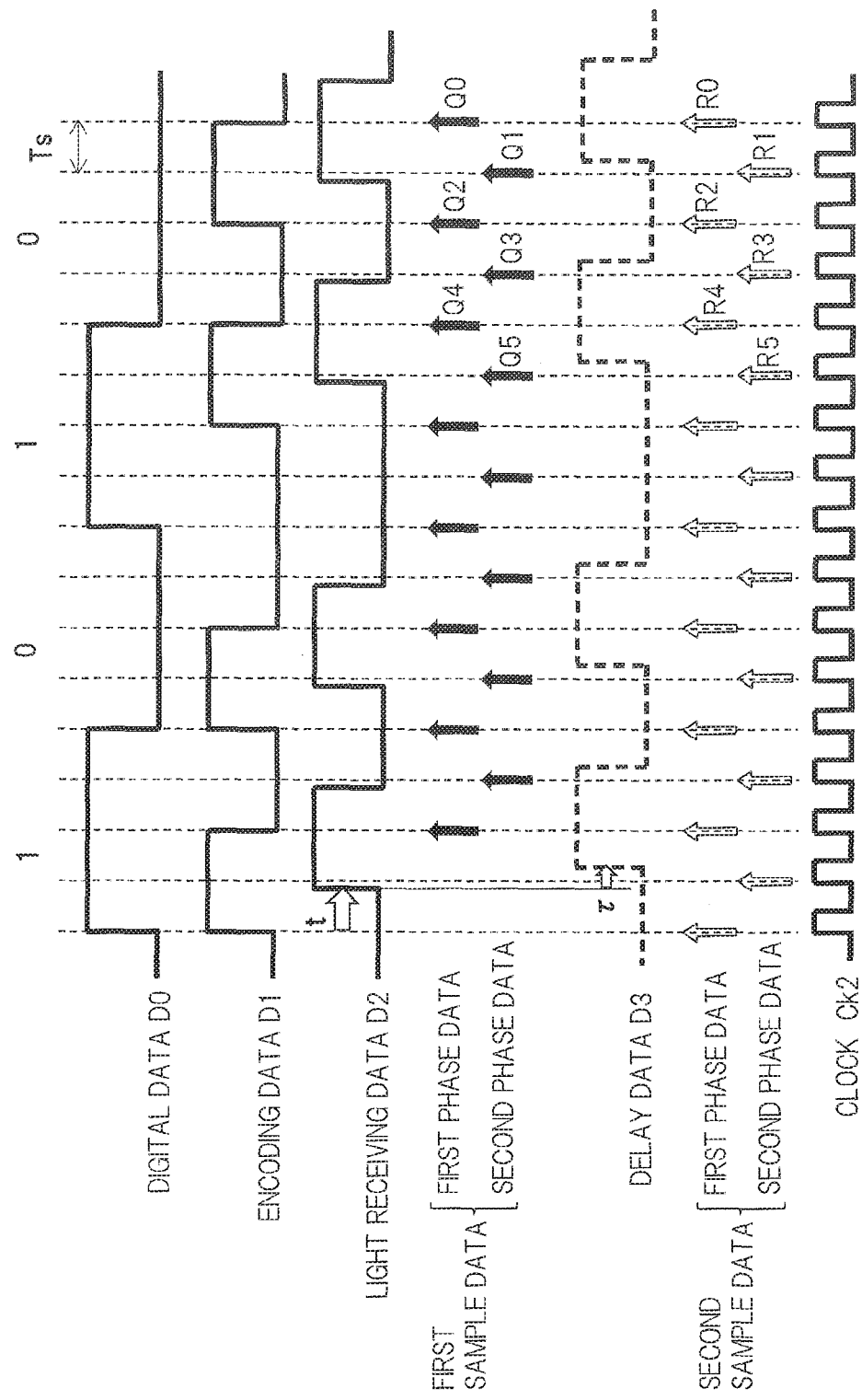
FIG. 2 is a timing chart of the semiconductor device according to the first embodiment.

FIG. 1 is a schematic block diagram of a semiconductor device 1 according to a first embodiment. FIG. 2 is a timing chart of the semiconductor device 1 illustrated in FIG. 1.

As illustrated in FIG. 1, the semiconductor device 1 according to the present embodiment includes a frequency conversion circuit 2, a first photocoupler 3, an ADC (Analog to Digital Converter) 4, an encoding circuit 5, a second photocoupler 6, and a demodulating circuit 7.

The frequency conversion circuit 2 converts the frequency of an externally inputted clock Ck0 and generates a clock Ck1 and a clock Ck2. The frequency of the clock Ck1 is two times higher than that of the clock Ck0, and the frequency of the clock Ck2 is four times higher than that of the clock Ck0. For example, the frequency conversion circuit 2 first generates the clock Ck2 from the clock Ck0, and subsequently, generates the clock Ck1 by dividing the frequency of the clock Ck2.

The first photocoupler 3 includes a first light emitting element 31 and a first light receiving element 32. In the first photocoupler 3, the clock Ck1 is optically transmitted from the first light emitting element 31 to the first light receiving element 32. The first light receiving element 32 outputs the clock Ck1 to the ADC 4 and to the encoding circuit 5.

The ADC 4 converts analog data to digital data D0 on the basis of the clock Ck1 inputted thereto via the first photocoupler 3. In the case where the digital data D0 is inputted directly to the semiconductor device 1, the ADC 4 is unnecessary.

The encoding circuit 5 generates encoded data D1 by executing differential Manchester encoding on the digital data D0 on the basis of the clock Ck1 inputted thereto via the first photocoupler 3. The frequency of the encoded data D1 is equal to that of the clock Ck1.

As shown in FIG. 2, in the encoded data D1 obtained through differential Manchester encoding, a data value "0" of the digital data D0 has the same code as that of the previous data value. On the other hand, a data value "1" of the digital data D0 has a code opposite to that of the previous data value.

Referring back to FIG. 1, the second photocoupler 6 includes a second light emitting element 61 and a second light receiving element 62. The second light emitting element 61 optically transmits the encoded data D1 to the second light receiving element 62. The second light receiving element 62 outputs, to the demodulating circuit 7, light reception data D2 which is the encoded data D1 optically received by the second light receiving element 62. As shown in FIG. 2, the phase of the light reception data D2 is delayed by time t relative to the phase of the encoded data D1.

The above first light emitting element 31 and the above second light emitting element 61 consist of a light emitting diode, for example. The first light receiving element 32 and the second light receiving element 62 consist of a photodiode, for example. The first photocoupler 3 and the second photocoupler 6 may be optical devices independently of each other as in the present embodiment, or may be optical devices integrated with each other. Alternatively, these photocouplers may be replaced with galvanic coupling elements which are obtained by magnetic coupling using a coil pair, capacitive coupling using capacitors, magnetic coupling using magnetoresistive elements, or the like.

The semiconductor device 1 may be configured such that a semiconductor chip including the ADC 4, the encoding circuit 5, the first light receiving element 32, and the second light emitting element 61 is formed on the data transmission side (the primary side), while a semiconductor chip including the frequency conversion circuit 2, the first light emitting element 31, the second light receiving element 62, and the demodulating circuit 7 is formed on the data reception side (the secondary side).

Figure 3:
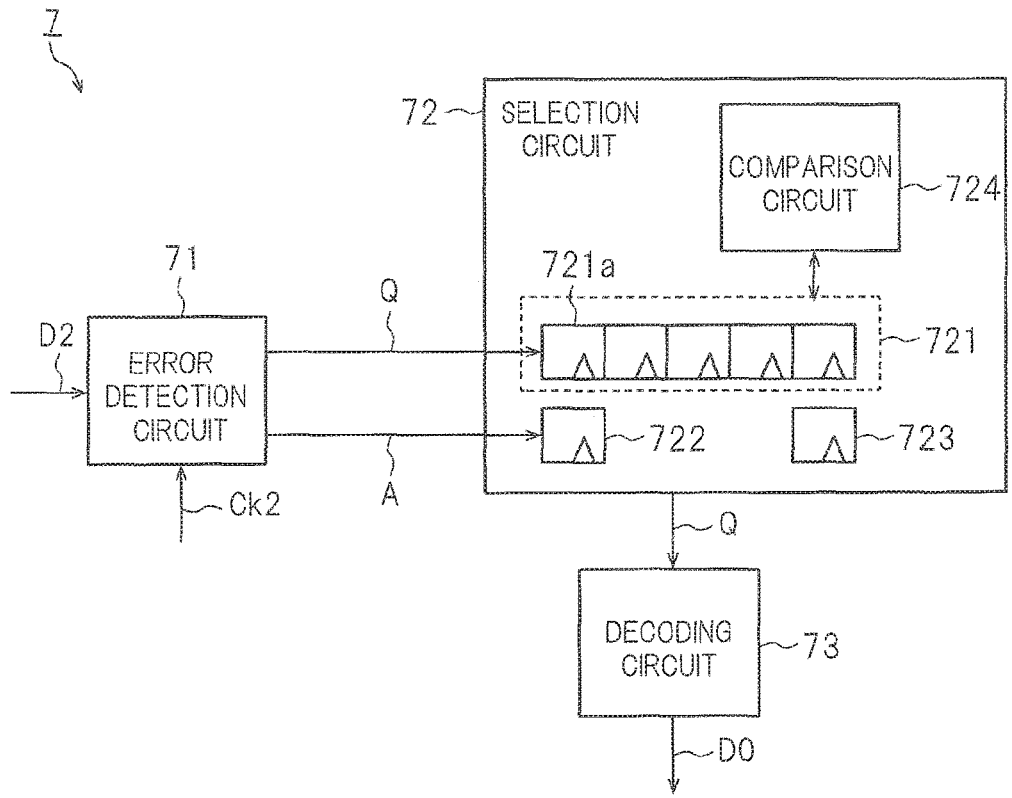
FIG. 3 is a block diagram schematically illustrating a demodulating circuit according to the first embodiment.

FIG. 3 is a schematic block diagram of the demodulating circuit 7. The demodulating circuit 7 includes an error detection circuit 71, a selection circuit 72, and a decoding circuit 73. First, the error detection circuit 71 is described with reference to FIG. 4.

Figure 4:
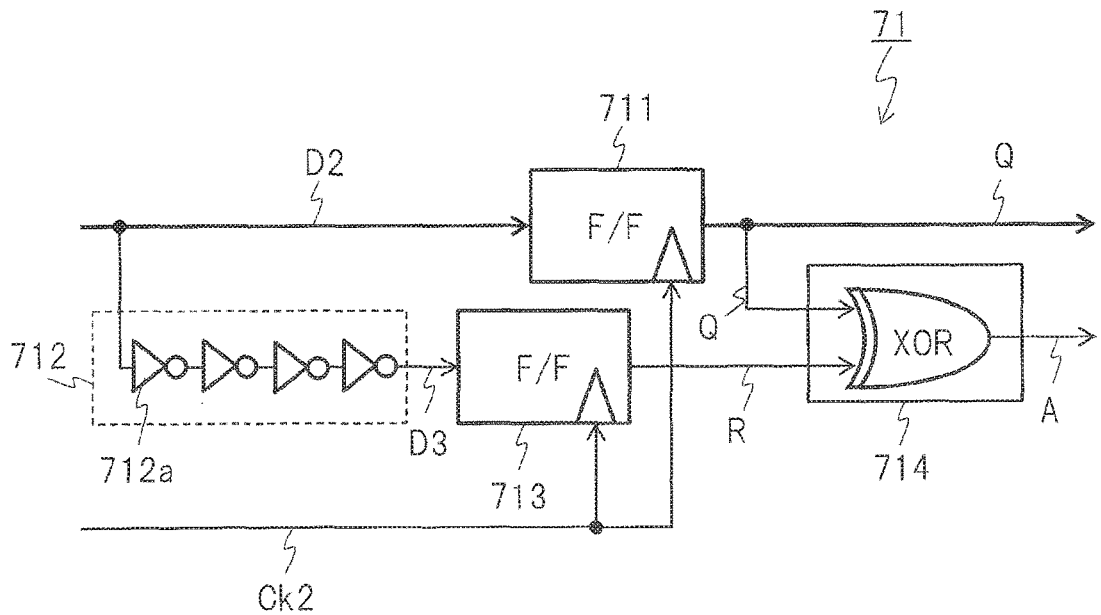
FIG. 4 is a block diagram schematically illustrating an error detection circuit according to the first embodiment.

FIG. 4 is a schematic block diagram of the error detection circuit 71. The error detection circuit 71 includes a first sampling circuit 711, a delaying circuit 712, a second sampling circuit 713, and a determination circuit 714.

The first sampling circuit 711 includes a flip-flop that oversamples the light reception data D2 on the basis of the clock Ck2. The frequency of the clock Ck2 is set to be two times higher than that of the light reception data D2 (the encoded data D1). That is, the sampling frequency of the first sampling circuit 711 is two times higher than that of the light reception data D2.

The delaying circuit 712 is provided in the preceding stage of the second sampling circuit 713, and includes an even number of serially connected inverters 712a. Due to delay time τ set by the delaying circuit 712, the second sampling circuit 713 oversamples the light reception data D2 at a timing earlier than that in the first sampling circuit 711.

The second sampling circuit 713 includes a flip-flop that oversamples the delay data D3 on the basis of the clock Ck2. As shown in FIG. 2, the second sampling circuit 713 oversamples the delay data D3 which is delayed by the delay time τ, relative to the data oversampled by the first sampling circuit 711. For oversampling of the delay data D3, the delay time τ set by the delaying circuit 712 is shorter than a sampling period Ts which is obtained by inverting the sampling frequency (the frequency of the clock Ck2).

Referring back to FIG. 4, the determination circuit 714 includes an XOR circuit that determines whether or not the level of the first sample data Q outputted from the first sampling circuit 711 matches the level of second sample data R outputted from the second sampling circuit 713. Determination data A generated at the determination circuit 714 is inputted to the selection circuit 72.

Subsequently to the above description of the error detection circuit 71, a description of the selection circuit 72 illustrated in FIG. 3 is given. The selection circuit 72 includes a first storage circuit 721, a second storage circuit 722, a third storage circuit 723, and a comparison circuit 724. The first storage circuit 721 includes a plurality of flip-flops 721a. In the flip-flops 721a, a plurality of the first sample data Q are temporarily stored in the sampling order.

The second storage circuit 722 includes a flip-flop that temporarily stores the determination data A generated at the determination circuit 714. The third storage circuit 723 includes a flip-flop that temporarily stores a flag for discriminating between first phase data and second phase data.

In the present embodiment, the first sample data Q from the first sampling circuit 711 is divided into first phase data Q0, Q2, and Q4 and second phase data Q1, Q3, and Q5, as shown in FIG. 2. In other words, the first phase data corresponds to the even-numbered first sample data Q, and the second phase data corresponds to the odd-numbered first sample data Q.

Similarly, the second sample data R from the second sampling circuit 713 is divided into first phase data R0, R2, and R4, and second phase data R1, R3, and R5.

A flag to be stored in the third storage circuit 723 indicates which of, among the first sample data Q, the first phase data or the second phase data is set as selected data to be outputted from the selection circuit 72. In addition, when the determination data A generated at the determination circuit 714 indicates that the first sample data Q and the second sample data R mismatch each other, this flag is switched.

For example, when the determination data A indicative of mismatching is stored in the second storage circuit 722 while the first phase data is set as the selected data, the selected data is switched from the first phase data to the second phase data through flag switching.

When the flag is switched, the comparison circuit 724 compares the first sample data Q stored in the first storage circuit 721 with one another, and determines whether or not to output to the decoding circuit 73, on the basis of the result of comparison.

The decoding circuit 73 decodes the selected data selected by the selection circuit 72, and thereby generates digital data D4. The digital data D4 corresponds to the digital data D0 that has not undergone differential Manchester encoding by the encoding circuit 5. In order to adjust a timing for outputting the digital data D4, a FIFO (First In First Out) circuit (not illustrated) may be provided in the subsequent stage of the decoding circuit 73.

Figure 5:
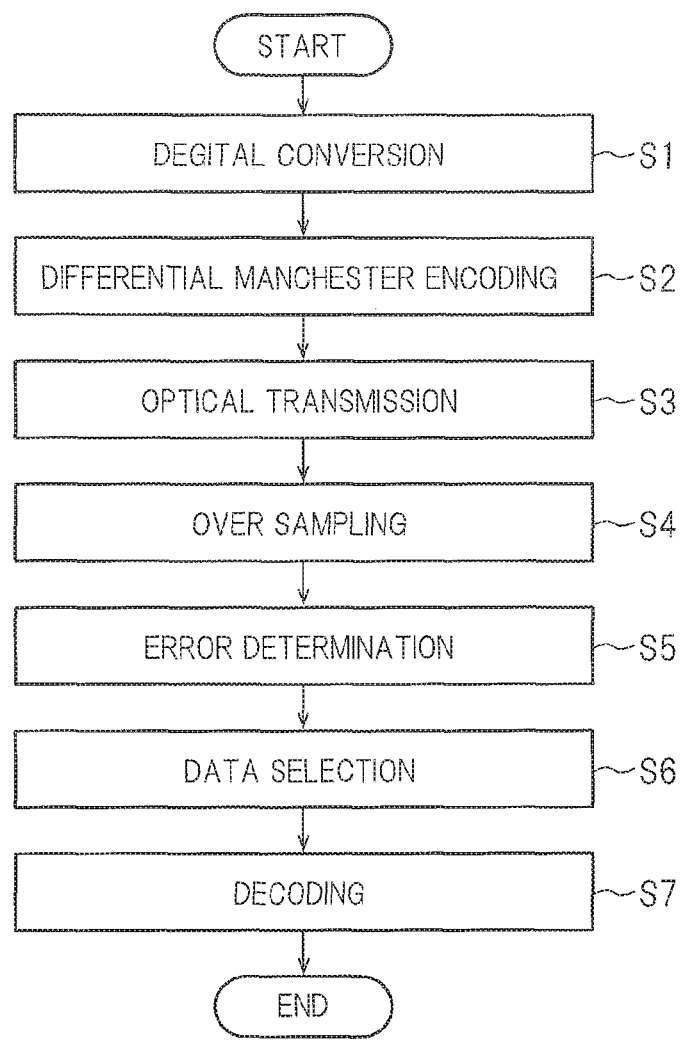
FIG. 5 is a flowchart of the semiconductor device according to the first embodiment.

An operation of the semiconductor device 1 according to the present embodiment is described below. FIG. 5 is a flowchart of the semiconductor device 1. Here, an operation procedure concerning data processing is described.

First, the ADC 4 performs digital conversion of analog data, and outputs the digital data D0 to the encoding circuit 5 (step S1). In the present embodiment, the digital data D0 is serial data the frequency of which is set to 25 MHz.

Next, the encoding circuit 5 executes differential Manchester encoding on the digital data D0, and outputs the encoded data D1 to the second photocoupler 6 (step S2). The frequency of the encoded data D1 is two times higher than that of the digital data D0, that is, 50 MHz.

Next, the second photocoupler 6 optically transmits the encoded data D1 (step S3). As a result, the encoded data D1 is converted into the light reception data D2. The frequency of the light reception data D2 is equal to the frequency of the encoded data D1, that is, 50 MHz.

Next, the first sampling circuit 711 and the second sampling circuit 713 oversample the light reception data D2 at different timings (step S4). Next, the determination circuit 714 performs error determination as to the first sample data Q (step S5). Here, the operation at step S5 is described in detail with reference to FIG. 2.

For example, a case is described where, at step S5, the determination circuit 714 compares the second phase data Q1 and the second phase data R1 which are shown in FIG. 2. Since the second phase data Q1 and the second phase data R1 mismatch each other in FIG. 2, the determination circuit 714 outputs, to the selection circuit 72, the determination data A indicating that the second phase data Q1 is error data.

Subsequently to comparison of the second phase data Q1 and the second phase data R1, the determination circuit 714 compares the first phase data Q0 and the first phase data R0.

In FIG. 2, the first phase data Q0 and the first phase data R0 match each other at a high level. This means the absence of a level transition, in the light reception data D2, immediately prior to the first phase data Q0 (strictly speaking, prior to the delay time τ). In this case, the determination circuit 714 outputs, to the selection circuit 72, the determination data A indicating that the first phase data Q0 is not error data.

In the present embodiment, since the light reception data D2 has undergone differential Manchester encoding, there are short-period level transitions. Further, the sampling frequencies of the first sampling circuit 711 and the second sampling circuit 713 are each set to be two times higher than the frequency of the light reception data D2. Accordingly, in the first sample data Q, at least the first phase data or the second phase data is correct data having high reliability.

At step S5, every time the determination circuit 714 outputs the determination data A, the selection circuit 72 selects the first phase data or the second phase data of the first sample data Q and outputs to the decoding circuit 73, or outputs no data (step S6).

In each of the flip-flops 721a provided in the first storage circuit 721 of the selection circuit 72, the first phase data and the second phase data of the first sample data Q are alternately stored. Here, when a flag for causing the third storage circuit 723 to selectively sample the first phase data is set as initial setting, only the first phase data are outputted from the first storage circuit 721 to the decoding circuit 73. The decoding circuit 73 decodes the outputted the first phase data (step S7).

When the determination circuit 714 determines that the second phase data as well as the first phase data is not error data at step S5, either of the first phase data and the second phase data may be decoded. In the present embodiment, the phase data that is set by the flag is preferentially selected.

Moreover, at step S6, a case may be expected where the selected data selected by the selection circuit 72, that is, correct phase data is switched between the first phase data and the second phase data of the first sample data Q during reception of the light reception data D2. A switching operation for selection of data for such a case is described with reference to FIGS. 6, 7A, and 7B.

Figure 6:
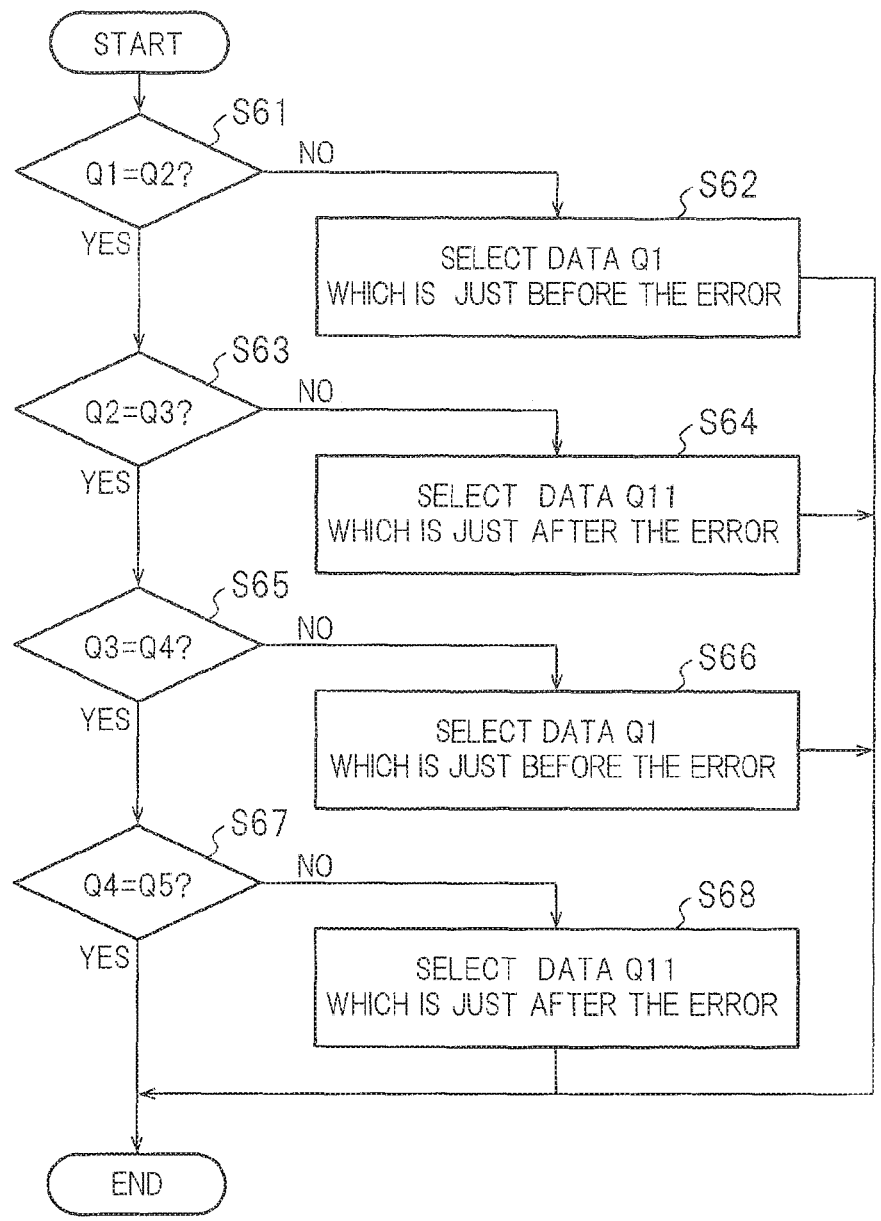
FIG. 6 is a flowchart showing a switching operation procedure for selection of first sample data Q.
Figure 7A:
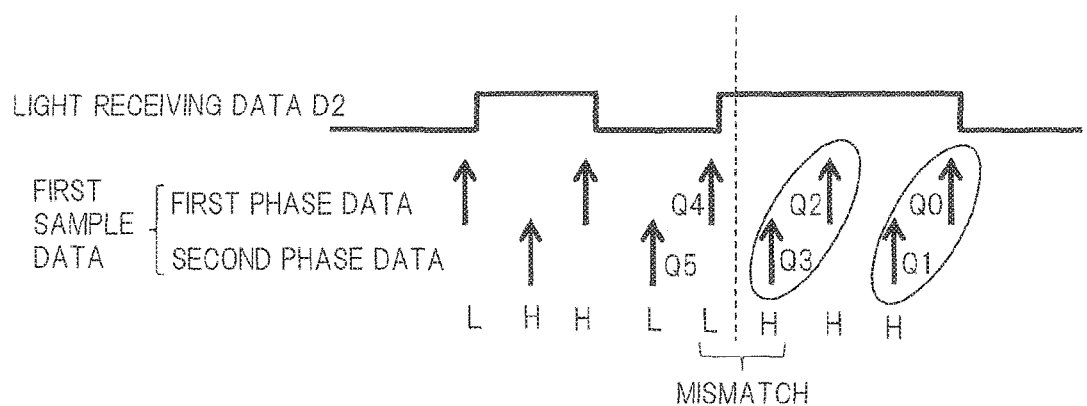
FIG. 7A is a schematic diagram illustrating one example of details of a switching operation for selection of first sample data Q.
Figure 7B:
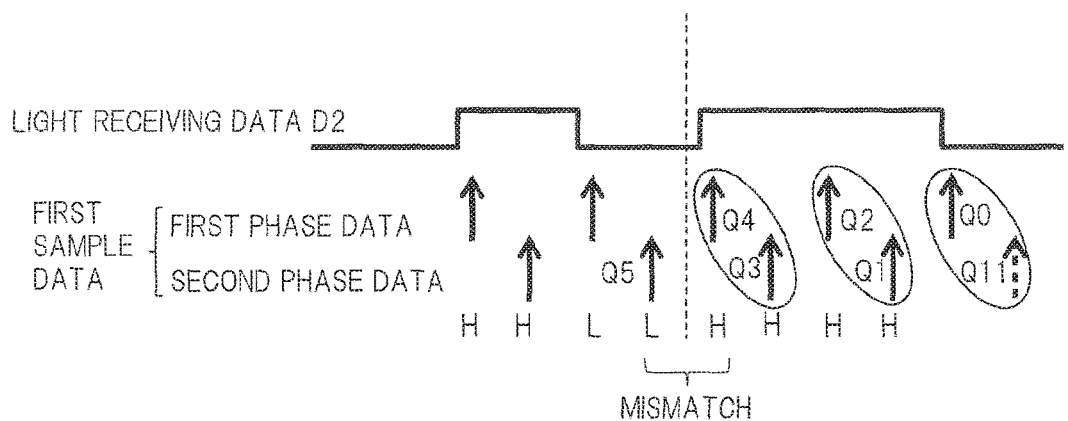
FIG. 7B is a schematic diagram illustrating another example of details of the switching operation for selection of first sample data Q.

FIG. 6 is a flowchart indicating a switching operation procedure for selection of the first sample data Q. FIGS. 7A and 7B are schematic diagrams each illustrating the details of a switching operation for selection of the first sample data Q.

For example, when the determination circuit 714 determines the first phase data Q0 as error data, the comparison circuit 724 of the selection circuit 72 compares the second phase data Q1 (first stored data) which has been stored, in the first storage circuit 721, immediately before the first phase data Q0, with the first phase data Q2 (second stored data) which has been stored, in the first storage circuit 721, previously to the second phase data Q1 (step S61).

In the present embodiment, the light reception data D2, on which sampling is to be performed, has undergone differential Manchester encoding. Thus, when the second phase data Q1 and the first phase data Q2 mismatch each other, the boundary between the second phase data Q1 and the first phase data Q2 represents a data breakpoint. In this case, the second phase data Q1 which has been sampled immediately before the first phase data Q0 takes, as correct data, the place of the first phase data Q0. Thus, the comparison circuit 724 selects the second phase data Q1 (step S62).

At step S61, when the second phase data Q1 and the first phase data Q2 match each other, the comparison circuit 724 compares the first phase data Q2 with the second phase data Q3 (third stored data) which has been stored, in the first storage circuit 721, previously to the first phase data Q2 (step S63). When the first phase data Q2 and the second phase data Q3 mismatch each other, the boundary between the first phase data Q2 and the second phase data Q3 represents a data breakpoint. In this case, the comparison circuit 724 selects, as data to take the place of the first phase data Q0, second phase data Q11 which is sampled immediately after the first phase data Q0 (step S64).

At steps S64 to S68, the comparison circuit 724 compares the first phase data with the second phase data sequentially in a retrospective manner, and selects the second phase data Q1 or the second phase data Q11 on the basis of the result of comparison, in the similar way taken at steps S61 to S64. For example, when the second phase data Q1 is selected, the second phase data Q1 is, in place of the first phase data Q0, transmitted to the decoding circuit 73. Alternatively, when the second phase data Q11 is selected, none of the phase data is transmitted to the decoding circuit 73 during the cycle, and the second phase data Q11 which is sampled in the next cycle is, in place of the first phase data Q0, transmitted to the decoding circuit 73.

FIG. 7A schematically shows an operation at steps S65 and S66. On the other hand, FIG. 7B schematically shows an operation at steps S67 and S68. In the present embodiment, the light reception data D2 undergoes differential Manchester encoding, and further, is oversampled at a sampling frequency two times higher than the frequency thereof. Accordingly, even when an error data is generated during reception of the light reception data D2, the phase data previous to or next to the error data can be specified as correct data by comparison of at least five first sample data Q previous to the error data.

According to the present embodiment which has been described above, data undergoes, at the data transmission side, differential Manchester encoding which causes short-period level transitions, and the encoded data is optically transmitted. On the other hand, the data optically received at the data reception side is oversampled by the first sampling circuit 711 and the second sampling circuit 713 at different timings and at a sampling frequency two times higher than that of the received data. Thereafter, determination for the sample data obtained by the respective sampling circuits is made by the determination circuit 714.

The determination data A generated at the determination circuit 714 pertains to the presence or absence of a level transition in the light reception data D2 immediately before the sample data from the first sampling circuit 711, in other words, pertains to the reliability of the sample data. Thus, sample data having high reliability is decoded, whereby the possibility of generating a data error at the reception side can be reduced.

Second Embodiment

A semiconductor device according to a second embodiment is described, and mainly, differences from that of the first embodiment are described. The present embodiment is different from the first embodiment in that the demodulating circuit 7 of the present embodiment includes an error detection circuit 81.

Figure 8:
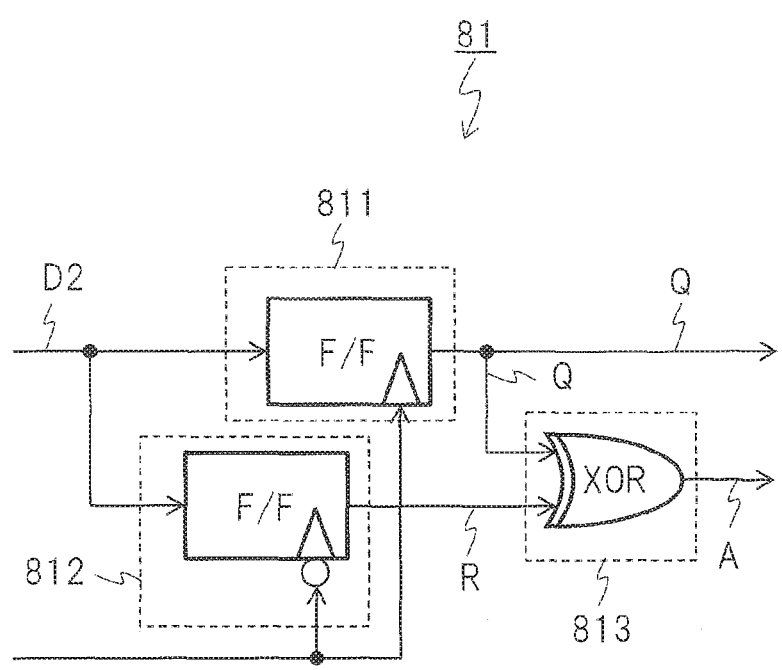
FIG. 8 is a schematic block diagram of an error detection circuit according to a second embodiment.
Figure 9:
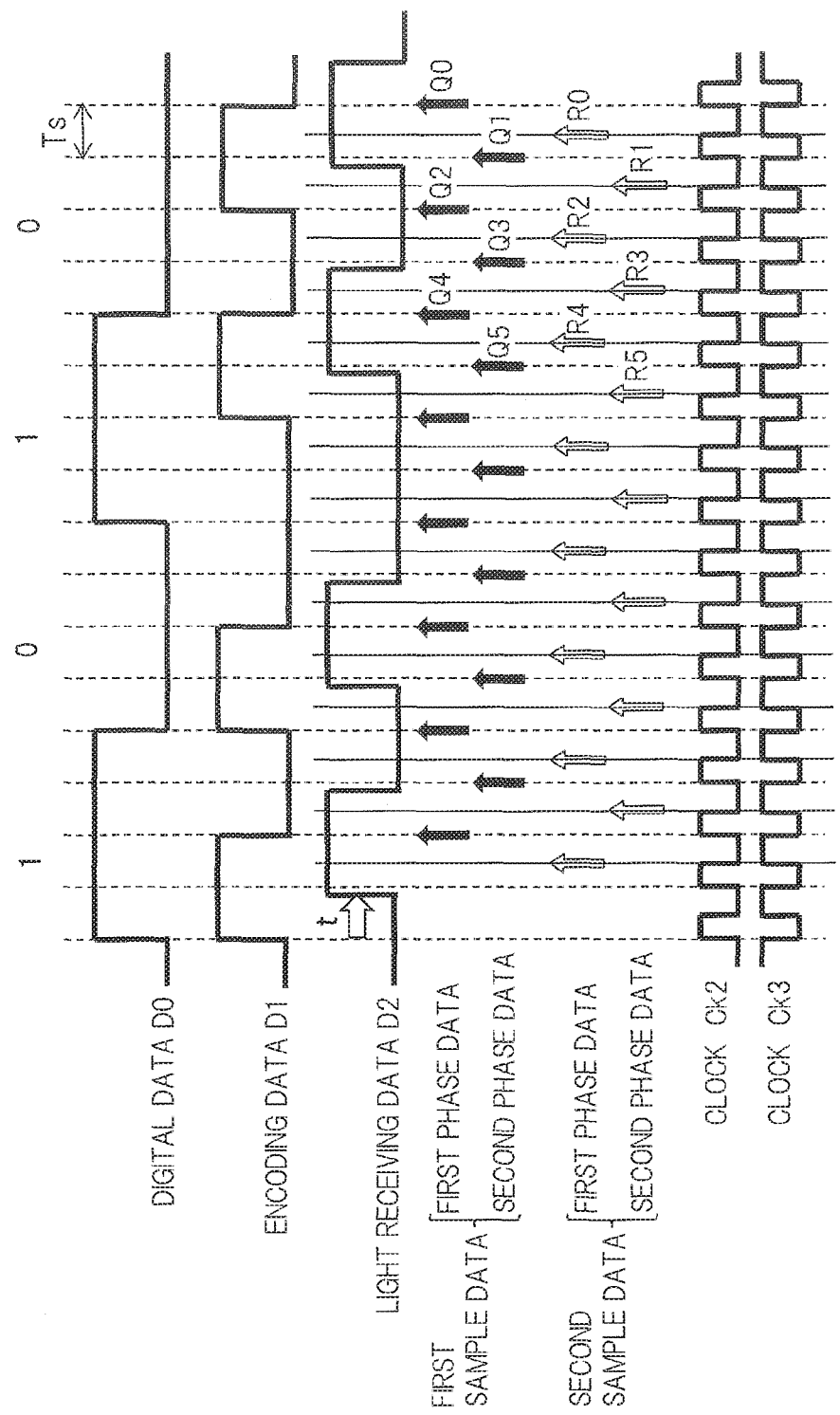
FIG. 9 is a timing chart of a semiconductor device according to the second embodiment.

FIG. 8 is a schematic block diagram of an error detection circuit according to the second embodiment. FIG. 9 is a timing chart of the semiconductor device according to the second embodiment.

The error detection circuit 81 illustrated in FIG. 8 includes a first sampling circuit 811, a second sampling circuit 812, and a determination circuit 813. The first sampling circuit 811 is similar to the first sampling circuit 711 described in the first embodiment, and thus, an explanation thereof is omitted.

The second sampling circuit 812 oversamples the light reception data D2 at the same sampling frequency as that of the first sampling circuit 811. Here, the second sampling circuit 812 oversamples the light reception data D2 on the basis of a timing of the clock Ck3 which is an inverted timing of the clock Ck2, as shown in FIG. 9. In this case, as in the first embodiment, the second sample data R is sampled by the waveform at a timing earlier than that in the first sample data Q of the first sampling circuit 811.

In the same manner as the determination circuit 714 described in the first embodiment, the determination circuit 813 determines whether or not the first sample data Q and the second sample data R match each other, and outputs the determination data A to the selection circuit 72. In order to cause the first sample data Q and the determination data A to be inputted to the selection circuit 72 at the same timing, the error detection circuit 81 may be provided with flip-flops (not illustrated) which are respectively disposed in the subsequent stage of the first sampling circuit 811 and in the subsequent stage of the determination circuit 813.

According to the present embodiment having been described above, the second sampling circuit 812 can, by using the clock Ck3, oversample the light reception data D2 at the timing earlier than that in the first sampling circuit 811. Thereafter, data having high reliability is selected and decoded, as in the first embodiment. Therefore, the possibility of generating a data error at the reception side can be reduced.

Furthermore, the present embodiment does not require the delaying circuit 712 described in the first embodiment. In this case, variation of a delay time due to variation in characteristics of the delaying circuit 712 is reduced. Accordingly, a sampling operation of the second sampling circuit 812 is stabilized, whereby reliability in data reception can be further improved.

Third Embodiment

In each of the first and second embodiments, as one example of signal transmission means, the coupler in which optical signals from the light emitting elements 31, 61 are received by the light receiving elements 32, 62, respectively while an insulation state is maintained, has been described. However, the coupler can be achieved not only by an insulation device such as an optical coupling device in which an optical signal is transmitted and received, but also by an insulation device in which a signal is transmitted in a non-contact manner by means of a galvanic coupling element for magnetic coupling or capacitive coupling, for example.

To perform signal transmission through magnetic coupling, a coil on a transmission chip side and a coil on a reception chip side may be arranged such that magnetic coupling is obtained therebetween. Alternatively, a coil may be provided on a transmission chip side while a resistance bridge circuit or a magnetoresistive element may be provided on a reception chip side.

To perform signal transmission through capacitive coupling, a capacitor may be provided between a transmission chip and a reception chip such that one electrode of the capacitor is connected to the transmission chip while the other electrode is connected to the reception chip, for example.

Even in an insulation device in which signal transmission is performed through magnetic coupling or capacitive coupling, data is transmitted by means of a signal which has undergone differential Manchester encoding at the data transmission side such that a level transition occurs in a short time period, or by means of an OOK (On-Off Keying) signal modulated at the data transmission side, etc. On the other hand, data received at the data reception side is oversampled by the first sampling circuit 711 and the second sampling circuit 713 at different timings and at a sampling frequency two times higher than the frequency of the data. Thereafter, determination for the sample data obtained by the sampling circuits is made by the determination circuit 714.

The determination data A generated at the determination circuit 714 pertains to the presence or absence of a level transition in the received data D2 immediately prior to the sample data obtained by the first sampling circuit 711, in other words, pertains to the reliability of the sample data. Accordingly, sample data having high reliability is decoded, whereby the possibility of generating a data error at the reception side can be reduced.

By using the clock Ck3, the second sampling circuit 812 can oversample the light reception data D2 at the timing earlier than that in the first sampling circuit 811. Thereafter, data having high reliability is selected and decoded, as in the first embodiment. Accordingly, the possibility of generating a data error at the reception side can be reasonably reduced.

Figure 10:
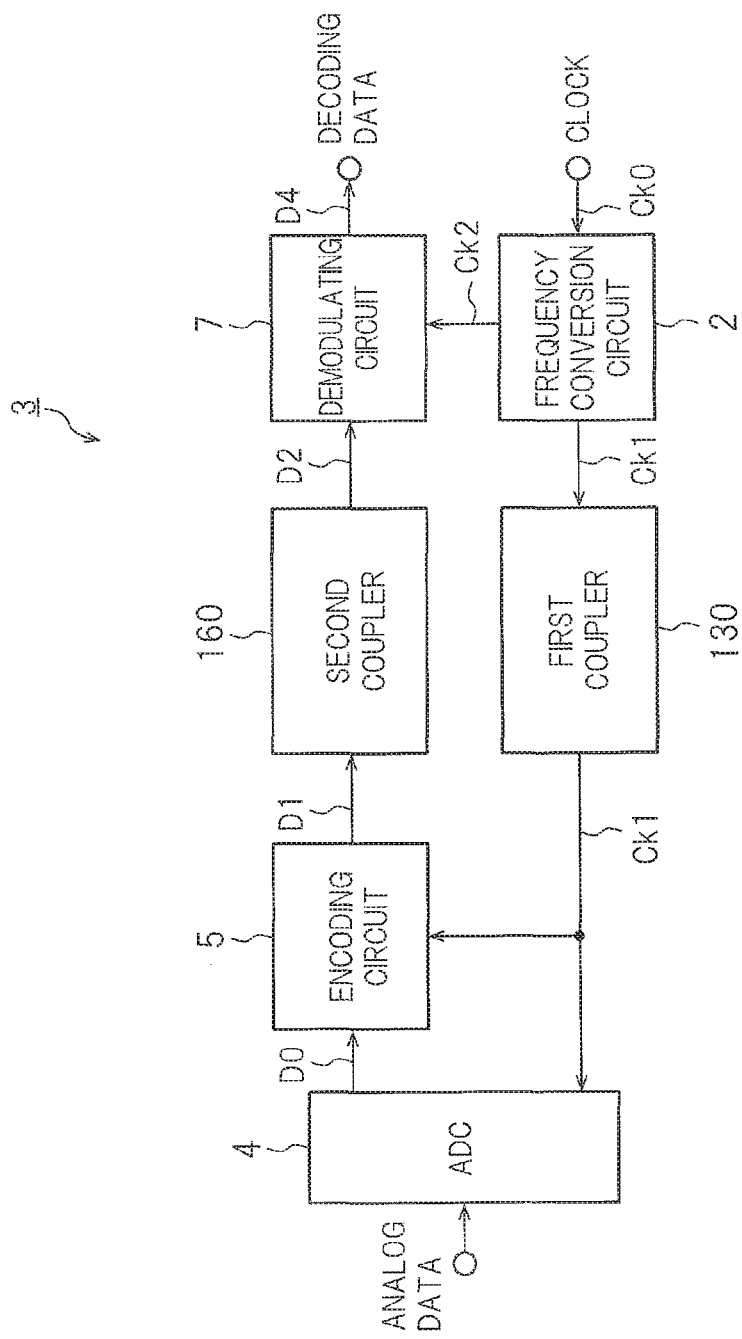
FIG. 10 is a schematic block diagram of a semiconductor device according to a third embodiment.

FIG. 10 is a schematic block diagram of a semiconductor device according to the third embodiment. In FIG. 10, components identical to those in the semiconductor device 1 according to the first embodiment are denoted by the same reference numbers, and a detailed explanation thereof is omitted.

A semiconductor device 3 according to the present embodiment is different from the semiconductor device 1 according to the first embodiment in that the semiconductor device 3 includes a first coupler 130 and a second coupler 160, as illustrated in FIG. 10, in place of the first photocoupler 3 and the second photocoupler 6. Here, circuit examples of the first coupler 130 and the second coupler 160 are described with reference to FIGS. 11A to 11C.

Figure 11C:
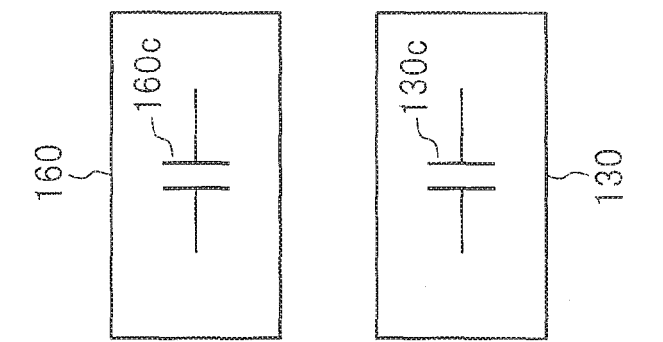
FIG. 11C is a diagram illustrating still another example of the coupler illustrated in FIG. 10.
Figure 11B:
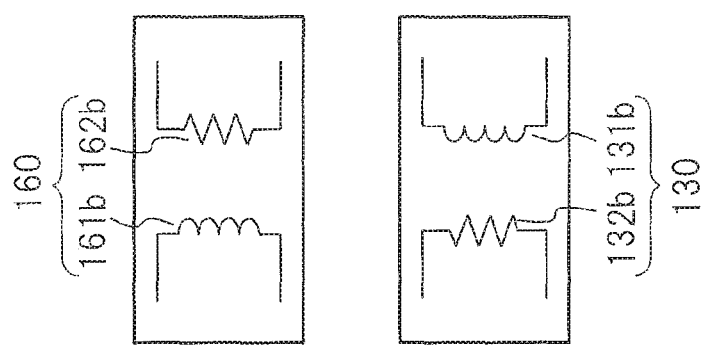
FIG. 11B is a diagram illustrating another example of the coupler illustrated in FIG. 10.
Figure 11A:
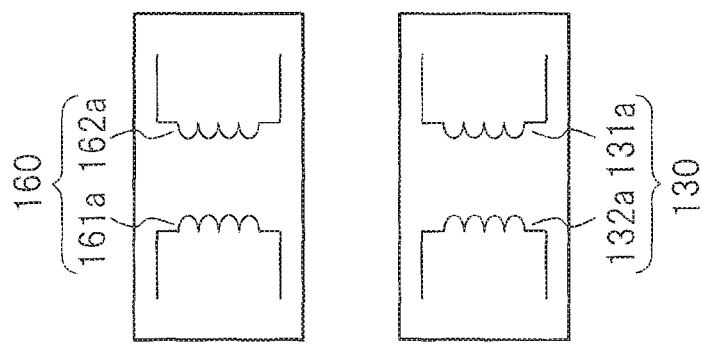
FIG. 11A is a diagram illustrating one example of a coupler illustrated in FIG. 10.

In the first coupler 130 illustrated in FIG. 11A, a transmission coil 131$a$ and a reception coil 132$a$ are provided in place of the light emitting element 31 and the light receiving element 32 of the first photocoupler 3, respectively. In the second coupler 160 illustrated in FIG. 11A, a transmission coil 161$a$ and a reception coil 162$a$ are provided in place of the light emitting element 61 and the light receiving element 62 of the second photocoupler 6, respectively.

In the first coupler 130 illustrated in FIG. 11B, a transmission coil 131$b$ and a magnetroresistive element 132$b$ are provided in place of the light emitting element 31 and the light receiving element 32, respectively. In the second coupler 160 illustrated in FIG. 11B, a transmission coil 161$b$ and a magnetroresistive element 162$b$ are provided in place of the light emitting element 61 and the light receiving element 62, respectively.

In the first coupler 130 illustrated in FIG. 11C, a capacitive coupling element 130$c$ is provided in place of the light emitting element 31 and the light receiving element 32. In the second coupler 160 illustrated in FIG. 11C, a capacitive coupling element 160$c$ is provided in place of the light emitting element 61 and the light receiving element 62.

In each of the first couplers 130 and the second couplers 160 illustrated in FIGS. 11A to 11C, passive elements such as the coils, the magnetoresitive elements, and the capacitive coupling elements are electrically insulated on a frame (not illustrated), and are each electrically connected to any one of the encoding circuit 5, the demodulating circuit 7, the frequency conversion circuit 2, and the ADC 4. Such passive elements may be separately arranged, or may be arranged as semiconductor chips mixed on the circuits. The semiconductor device 3 according to the present embodiment has a configuration in which galvanic isolation is achieved between a semiconductor chip on the data transmission side (the primary side) and a semiconductor chip on the data reception side (the secondary side) via the first coupler 130 and the second coupler 160.

Moreover, in each of the first coupler 130 and the second coupler 160, a transmission chip including a transmission circuit and a reception chip including a reception circuit are arranged on a frame so as to be electrically insulated from each other. On the reception chip or the transmission chip, a layered body of passive elements such as the insulated coils and the insulated capacitive coupling elements is integrated. Further, a case where, as independent elements, the first coupler 130 and the second coupler 160 are connected to the transmission and reception chips is encompassed by the present invention. In addition, the transmission and reception chips are connected by the frame and a wire, and are sealed with a resin.

The transmission and reception chips are sealed with an encapsulating resin made of silicone gel or silicone rubber, for example. Further, the transmission and reception chips are sealed with a molded resin, in addition to the encapsulating resin, so that the semiconductor device is configured. In view of ensuring the same operations among circuits including a reference voltage generation circuit unit, etc. provided in each of the transmission and reception circuits, it is preferable that the encapsulating resin has substantially the same thicknesses and substantially the same amounts at the transmission and reception chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first coupler;
   an encoding circuit which executes differential Manchester encoding on digital data based on a clock inputted thereto via the first coupler, and which outputs an encoded data;
   a second coupler; and
   a demodulating circuit which demodulates the encoded data inputted thereto via the second coupler, wherein
   the demodulating circuit includes
      a first sampling circuit which samples the encoded data based on a sampling frequency set to be two times higher than that of the encoded data, and which outputs first sample data,
      a second sampling circuit which samples the encoded data at a timing earlier than that in the first sampling circuit based on the sampling frequency, and which outputs second sample data,
      a determination circuit which determines whether or not the first sample data and the second sample data match each other, and
      a selection circuit which selects first phase data obtained by even-numbered sampling or second phase data obtained by odd-numbered sampling from the first sample data, on the basis of determination data generated at the determination circuit, and wherein
   the first coupler and the second coupler include galvanic coupling elements which transmit the clock and the encoded data individually in a non-contact manner.

2. The semiconductor device according to claim 1, wherein the first coupler and the second coupler include a transmission coil and a reception coil which are magnetic coupling each other.

3. The semiconductor device according to claim 1, wherein
   the first coupler and the second coupler include a transmission coil and a magnetroresistive element which are magnetic coupling each other.

4. The semiconductor device according to claim 1, wherein the first coupler and the second coupler include a capacitive coupling element, respectively.

5. The semiconductor device according to claim 1, wherein
   the first coupler and the second coupler are connected to the transmission and reception chips as independent elements.

6. The semiconductor device according to claim 1, wherein
   the first coupler and the second coupler are included in the transmission and reception chips.

7. The semiconductor device according to claim 5, wherein
   the transmission and reception chips are sealed with a mold resin in addition to an encapsulating resin.

8. The semiconductor device according to claim 6, wherein
   the transmission and reception chips are sealed with a mold resin in addition to an encapsulating resin.

9. The semiconductor device according to claim 7, wherein
   the transmission and reception chips are connected by a frame and a wire.

10. The semiconductor device according to claim 8, wherein
    the transmission and reception chips are connected by a frame and a wire.

11. A semiconductor device comprising:
    a coupler;
    an encoding circuit which executes differential Manchester encoding on digital data based on a clock inputted thereto, and which outputs an encoded data; and
    a demodulating circuit which demodulates the encoded data, wherein
    the demodulating circuit includes
       a first sampling circuit which samples the encoded data based on a sampling frequency set to be two times higher than that of the encoded data, and which outputs first sample data,
       a second sampling circuit which samples the encoded data at a timing earlier than that in the first sampling circuit based on the sampling frequency, and which outputs second sample data, a determination circuit which determines whether or not the first sample data and the second sample data match each other, and a selection circuit which selects first phase data obtained by even-numbered sampling or second phase data obtained by odd-numbered sampling from the first sample data, on the basis of determination data generated at the determination circuit, and wherein the coupler include galvanic coupling elements which transmit the encoded data in a non-contact manner.

* * * * *